United States Patent
Mehta et al.

(10) Patent No.: US 6,570,212 B1
(45) Date of Patent: May 27, 2003

(54) COMPLEMENTARY AVALANCHE INJECTION EEPROM CELL

(75) Inventors: Sunil D. Mehta, San Jose, CA (US); Steven Fong, Santa Clara, CA (US); Stewart Logie, Campbell, CA (US)

(73) Assignee: Lattice Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 09/578,086

(22) Filed: May 24, 2000

(51) Int. Cl.[7] .............................. H01L 27/108
(52) U.S. Cl. ........................ 257/315; 257/314
(58) Field of Search ................ 257/314–316; 365/185.1–185.2

(56) References Cited

U.S. PATENT DOCUMENTS

| | | | |
|---|---|---|---|
| 4,924,278 A | | 5/1990 | Logie .................. 257/318 |
| 5,055,897 A | * | 10/1991 | Canepa et al. ............. 357/23.5 |
| 5,097,310 A | * | 3/1992 | Eimori et al. .............. 357/42 |
| 5,465,231 A | * | 11/1995 | Ohasaki .................. 365/185.33 |
| 5,719,427 A | * | 2/1998 | Tong et al. ................ 257/355 |
| 5,872,732 A | * | 2/1999 | Wong ..................... 365/185.18 |
| 5,898,614 A | * | 4/1999 | Takeuchi ................. 365/185.1 |
| 5,999,449 A | | 12/1999 | Mehta et al. ............. 365/185.05 |
| 6,034,893 A | * | 3/2000 | Mehta .................... 365/185.14 |
| 6,044,018 A | * | 3/2000 | Sung et al. ............... 365/185.18 |
| 6,215,700 B1 | * | 4/2001 | Fong et al. ............... 365/185.1 |

FOREIGN PATENT DOCUMENTS

| | | | | |
|---|---|---|---|---|
| JP | 57-192044 | * | 11/1982 | ............ H01L/21/66 |
| JP | 62-211945 | * | 9/1987 | ............ H01L/27/08 |
| JP | 3-101168 | * | 4/1991 | ............ H01L/29/788 |

* cited by examiner

*Primary Examiner*—Tom Thomas
*Assistant Examiner*—Ori Nadav
(74) *Attorney, Agent, or Firm*—Fleisler Dubb Meyer & Lovejoy LLP

(57) ABSTRACT

A non-volatile memory cell at least partially formed in a semiconductor substrate, comprising a first avalanche injection element having a first active region of a first conductivity type and a second active region of a second conductivity type, separated by a channel region of said second conductivity type; a second avalanche injection element having a third active region of said second conductivity type and sharing said second active region with said first avalanche injection element, the second avalanche injection element having a channel region of said first conductivity type; and a common floating gate at least partially overlying said first and second avalanche injection elements.

In a further embodiment, the first avalanche element has an N+/P junction, the second avalanche element has a P+/N junction, and the floating gate capacitively coupled to the first and second avalanche elements.

14 Claims, 2 Drawing Sheets

COMPLEMENTARY AVALANCHE INJECTION EEPROM CELL

BACKGROUND OF THE INVENTION

1. Field of the Invention

This invention relates generally to semiconductor devices, and more particularly, to electrically erasable programmable read only memory ("EEPROM") cells.

2. Description of Related Art

As with many types of integrated circuit devices, some of the main objectives of non-volatile memory device designers are to increase the performance of devices, while decreasing device dimensions and consequently increasing circuit density. Cell designers strive for designs which are reliable, scalable, cost effective to manufacture and able to operate at lower power, in order for manufacturers to compete in the semiconductor industry. Generally, arrays of individual memory cells are formed on a single substrate and combined with sense and read circuitry, and connected by row-wise and column-wise conductive regions or metallic conductors to allow for array wide bulk program and erase as well as selected bit programming.

Semiconductor process technology has continued to move toward defining smaller device features, and the conventional "stacked gate" EEPROM structure has given way to different cell designs and array architectures, all intended to increase density and reliability in the resulting circuit. In addition, in EEPROM devices used for programmable logic devices, designers strive to reduce power requirements of devices by reducing program and erase voltage requirements.

Conventionally, programmable logic EEPROMS were typically formed by stacked gate devices operating utilizing Fowler-Nordheim tunneling to program and erase the floating gate or in single polysilicon- based cells such as that set forth in U.S. Pat. No. 4,924,278. An alternative to the aforementioned Fowler-Nordheim tunneling-based cell structures is a nonvolatile memory cell that is programmed and erased using hot electrons or hot holes generated by Zener/avalanche breakdown over different regions of the cell oxide. One example of such a cell is shown in FIG. 1. The cell and its operation are disclosed in co-pending application Ser. No. 09/220,201 which is hereby specifically incorporated herein by reference.

In the device shown in FIG. 1, hot carriers generated by Zener/avalanche breakdown are employed to program and erase the memory cell. The device includes an (array) control gate ACG, floating gate FG, avalanche/Zener program element $Q_w$, a read transistor $Q_r$, and a sense transistor $Q_c$. The control gate ACG is used to accelerate hot electrons or hot holes selectively to or from the floating gate by capacitively coupling a field across the oxide that separates the avalanche element $Q_w$ from the floating gate. Floating gate FG is capacitively coupled to array control gate (ACG) voltage via capacitor 11. Avalanche/Zener program element $Q_w$ shares floating gate FG with sense transistor $Q_c$, and includes a first active region 12 and second active region 13.

Sense transistor $Q_c$ shares its drain 19 with source 17 of read transistor $Q_r$. Gate 14 of read transistor $Q_r$ is connected to word line WL. The drain of read transistor $Q_r$ is connected to a read signal select (product term) PT, while the source of sense transistor $Q_c$ is connected to sense signal (product term ground) PTG.

Silicon substrate 310 has a first conductivity type such as a P-type conductivity. An avalanche/Zener element $Q_w$ is electrically separated from the sense transistor $Q_c$ by a first insulated region 150, e.g. silicon dioxide, also formed in the semiconductor substrate 310.

Avalanche/Zener element $Q_w$ has first impurity region 13 and a second impurity region 12, all formed within a substrate 310 with a channel 30 positioned thereinbetween. Overlying the channel 30 is an oxide layer 40. The oxide layer 40 is typically composed of an insulating material, such as silicon dioxide, and has a thickness of approximately 80 to 150 angstroms. Oxide layer 40 may be deposited or grown (using conventional oxide deposition techniques) in a single process step. Impurity regions 12 and 13 consist of a heavily doped ($>10^{17}$–$10^{20}$cm$^{-2}$) boron implanted P+ regions. Channel 30 may include a shallowly diffused, N-type impurity doped region 30 with a doping concentration of the N-well $10^{17}$cm$^{-2}$, or may be provided with a supplemental implant to specifically adjust the concentration of the channel to a desired level to tailor the breakdown voltage of the device. By heavily doping P+ region 12/13, the junction breakdown voltage $V_{pp}$ is about 6–8V.

Floating gate FG overlies the program element oxide layer 40 and sense oxide layer 90. Floating gate FG is also formed of a conducting material, such as a polycrystalline silicon material.

The elements $Q_w$, $Q_c$ and $Q_r$ of EEPROM 10 are electrically coupled to certain electrical lines and gates in order to operate and control the functions of the EEPROM cell 10. As shown in FIG. 1, $WBL_e$ is electrically coupled to the program region 12, $WBL_p$ coupled to region 13, and WWL to N+ well 380. A product term ground (PTG) is electrically coupled to the sense source 21 of the sense transistor $Q_c$. A word line read (WL) is electrically coupled to the read gate 14 of the read transistor $Q_r$ and a Product Term (PT) is electrically coupled to the read drain 15. Table 1 shows the voltages used in programming (injecting electrons into the floating gate) and erasing (injecting holes into the floating gate) in the device shown in FIG. 1:

TABLE 1

|  | $WBL_{E,P}$ | WWL | ACG | PT | PTG | WL |
|---|---|---|---|---|---|---|
| Erase (NMOS) | 6 v | 0 v | 8 v | Float | 6 v | Vcc |
| Program (NMOS) | 6 v | 0 v | 0 v | Float | 0 v | 0 V |

Note that for a PMOS device, the $WBL_{E,P}$ voltage and WWL voltages for an erase mode may be −6V, 0V respectively or 0V and +6V respectively.) A significant advantage of the N-well configuration shown in FIG. 1 is the isolation of cell $Q_w$ with respect to other cells in an array. A further advantage is that hot electron/hole injection element can be scaled to smaller dimensions than traditional Fowler-Nordheim cells. Even with the scaling advantages presented by the EEPROM-type cells, designers constantly seek to improve the performance of such cells.

SUMMARY OF THE INVENTION

The invention, roughly described, comprises a non-volatile memory cell at least partially formed in a semiconductor substrate, comprising a first avalanche injection element having a first active region of a first conductivity type and a second active region of a second conductivity type, separated by a channel region of said second conductivity type; a second avalanche injection element having a third active region of said second conductivity type and sharing said second active region with said first avalanche injection element, the second avalanche injection element having a channel region of said first conductivity type; and a common floating gate at least partially overlying said first and second avalanche injection elements.

In a further embodiment, the invention describes a memory cell comprising a first avalanche element having an N+/P junction, a second avalanche element having a P+/N junction, and a floating gate capacitively coupled to the first and second avalanche elements.

In yet another embodiment of the invention, in an array of non-volatile memory cells, each cell comprises a first program junction having a high concentration of a first conductivity type adjoining a region of a second conductivity type; a second program junction having a high concentration of said second conductivity type adjoining a region of said first conductivity type; and a floating gate overlying at least a portion of said first and second junctions.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

Figure 1:
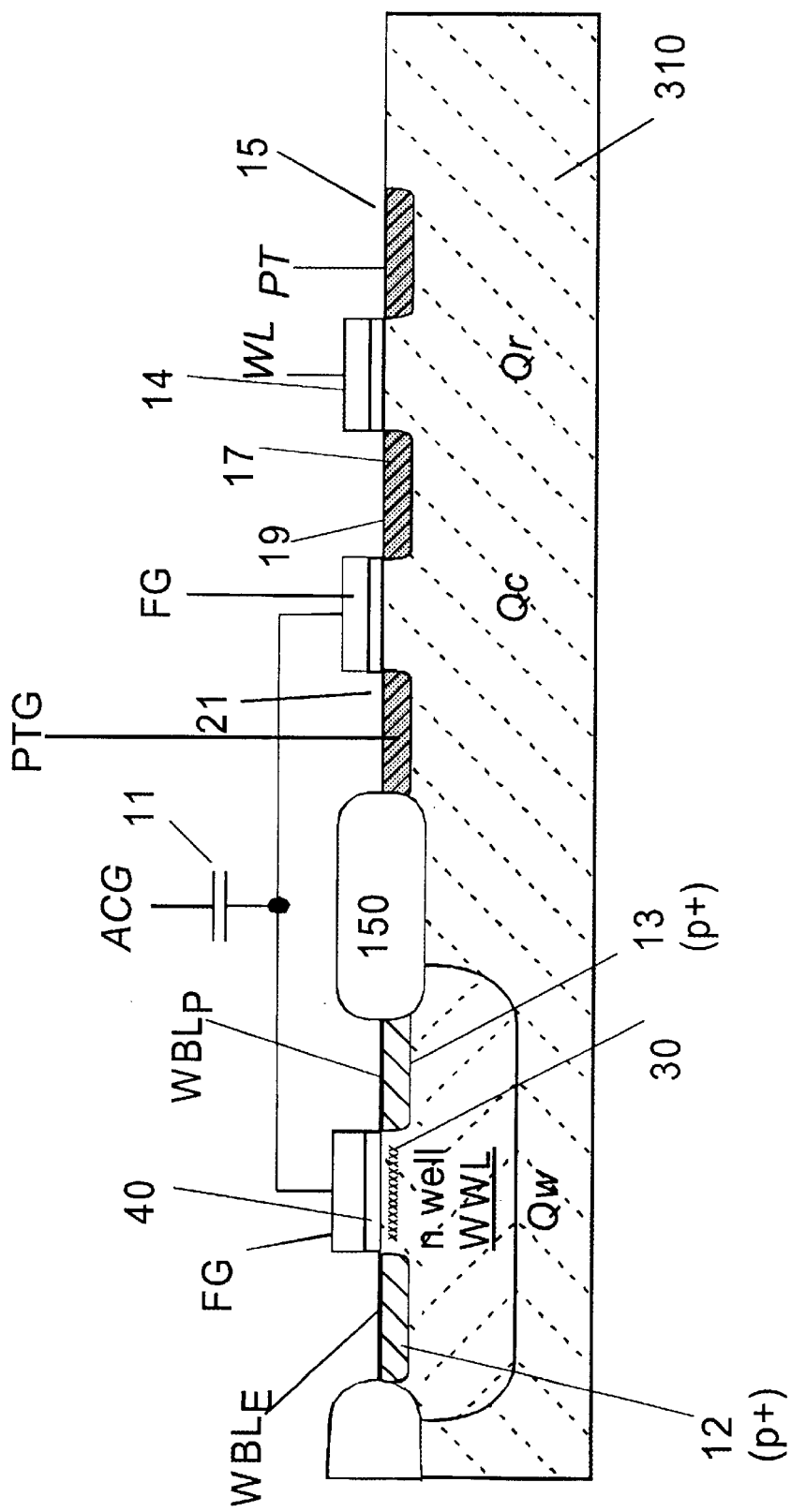
FIG. 1 is a cross section of an avalanche breakdown programmed non-volatile memory cell as such as that disclosed in copending patent application Ser. No. 09/220,201.
Figure 2:
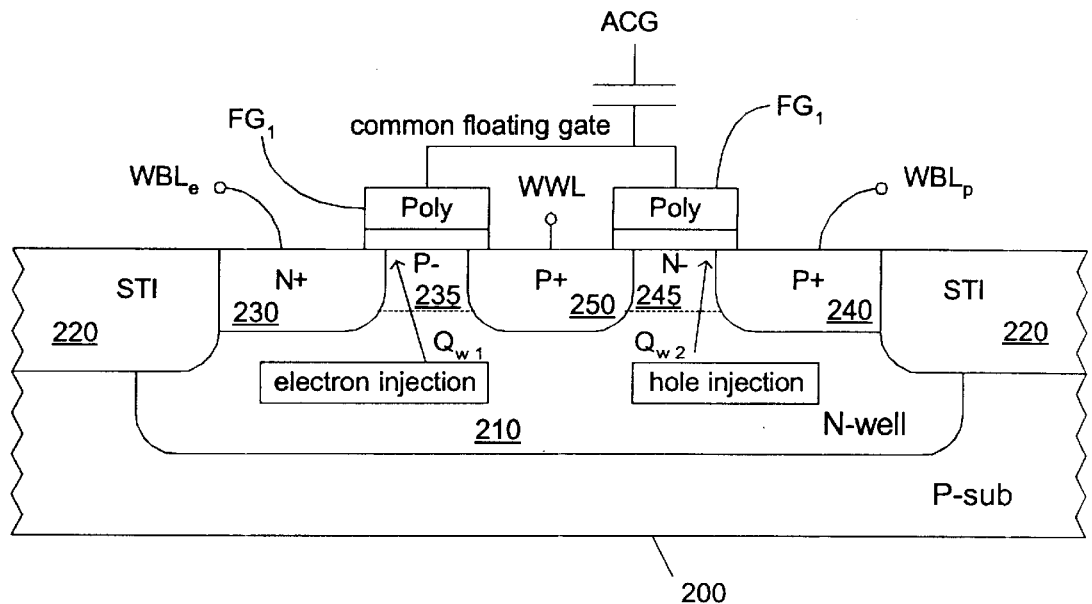
FIG. 2 is a cross section of a non-volatile memory cell constructed in accordance with the present invention.
Figure 3:
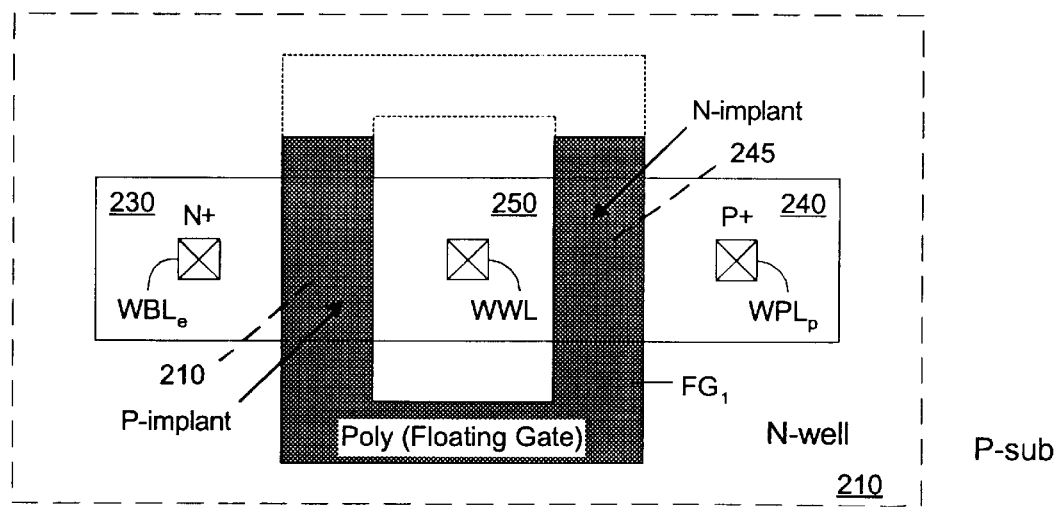
FIG. 3 is a plan view of the non-volatile memory cell constructed in accordance with the present invention.

Shown in FIGS. 2 and 3 are a cross-section and plan view, respectively, of a non-volatile memory cell of the present invention. Whereas previous avalanche injunction cells discussed above use a single type of junction (an N+/P junction or a P+/N junction for both the programming and erase activities), the cell of the present invention uses a complementary combination of junctions (that is, a P+/N and an N+/P), to accomplish respective programming and erase functions. It has been experimentally determined that programming is improved with a P+/N junction while erasing is easier with an N+/P junction. "Programming" in this application is defined as hole injection into the floating gate, and "erasing" is defined as electron injection into the floating gate. It should be recognized that the terms "program" and "erase" are used herein for convenience and should not to be considered as limiting to the invention. The invention has equal applicability when the term "program" is applied to electron injection and "erase" to hole injection.

It should be further recognized that the cell shown in FIGS. 2 and 3 comprises only the storage and programming portions of the cell, and that the cell may include, for example, a read transistor, a sense transistor and other elements, including conductors, as discussed above with respect to the cell disclosed in application Ser. No. 09/220, 201. Such devices are omitted in the description of the cell in FIGS. 2 and 3 in order not to unduly obscure the invention. In addition, the cell of the present invention is described with respect to an N-well embodiment. It should be recognized that the cell shown herein can be implemented in a P-well embodiment, and numerous variations on the characterization of the active regions and channels hereinafter described, including forming the entire device in a substrate having an N-type impurity background doping concentration, and forming the cell in different types of substrates including those other than silicon, as well as silicon-on-insulator substrates, is contemplated as being within the scope of the present invention.

Shown in FIGS. 2 and 3 is a silicon substrate 200 which may have a background doping density of a P-type impurity having, for example, a background doping of $10^{15}$–$10^{17}$ cm$^{-3}$, and is hence referred to herein as a P-substrate. Formed in the P-substrate is an N-well 210. As understood by one of average skill in the art, N-well 210 is formed by a diffusion of an impurity such as arsenic or phosphorous for a predetermined amount of time into the P-substrate 200. N-well 210 may have a doping concentration of approximately $10^{17}$. Alternative forms of N-well formation are well known to those of average skill in the art and all such methods of formation are contemplated as being within the scope of the invention including direct implantation followed by diffusion, graded implantation, and the like.

Shallow trench isolation regions 220 are shown in cross-section in FIG. 2 (but not shown in FIG. 3 for clarity) and isolate respective ones of individual cells from adjacent cells. It should be recognized that the form of the isolation regions 220 is not specific to the principles of the invention and alternative forms of device isolation, such as LOCOS, deep trench isolation, and the like, may be used in accordance with the present invention.

The cell of the present invention is comprised of a first injection device $Qw_1$, a second injection device $Qw_2$ and floating gate $FG_1$. Three active regions 230, 240 and 250 are provided in N-well 210. Regions 230 and 250 are separated by channel region 235; regions 240 and 250 are separated by channel region 245. Region 230 is a highly doped ($5\times10^{17}$–$1\times10^{21}$) cm$^{-2}$ of arsenic or phosphorous) N+ region; regions 240 and 250 are highly doped ($10^{18}$–$10^{20}$ cm$^{-2}$ boron) P+ regions. Floating gate $FG_1$ is formed of a polysilicon layer overlying oxide regions 262 and 264, which respectively overlie channel regions 235 and 245. Channel region 245 may have a doping concentration in the range of $10^{15}$–$10^{17}$ cm$^{-3}$ arsenic, or phosphorous (N-type) and region 235 $10^{15}$–$10^{17}$ cm$^{-3}$ of boron (P-type). Regions 230 and 250, along with channel 235 and floating gate $FG_1$, form a first injection device by utilizing the junction at the interface of channel 235 (P) and 230 (N+) (as described below) to inject hot electrons into floating gate $FG_1$ when the appropriate voltages are applied to regions 230, 250 and the ACG (to floating gate $FG_1$). Regions 240 and 250 along with channel 245 form a second injection device by utilizing the junction at the interface of channel 245 (N) and region 240 (P+) (as described below) to inject hot holes into floating gate $FG_1$. In one embodiment, when the cell is provided in an array, voltages are applied to the respective regions by coupling the active regions to common array control lines. N+ region 230 is coupled to the write bit line erase ($WBL_E$) array connection. P+ region 240 is connected to the write bit line program ($WBL_P$) array connection. P+ region 250 is connected to the word line (WWL).

In order to inject holes (program) or electrons (erase) in accordance with the present invention, voltages such as those shown in Table 2 are applied to the respective connections to enable programming and erase of the common floating gate $FG_1$:

TABLE 2

|  | $WBL_e$ | WWL | $WBL_p$ | ACG |
|---|---|---|---|---|
| Erase | $V_{pp}$ | 0 | $V_{pp}$ (or float) | $V_{pp}$ |
| Program | $V_{pp}'$ | $V_{pp}'$ (or float) | 0 | 0 |

In accordance with the invention, $V_{pp}$ is equal to the breakdown junction voltage (BVJ) of the N+/P junction which may vary in accordance with the doping concentration of respective region 230 and 233, and may be in a range of 3–8V. Likewise $V_{pp}'$ is the breakdown junction voltage of the P+/N region which will vary with the concentration of regions 240 and 245 and may be in a range of 3–8V.

It should be understood that the cell shown in FIGS. 2 and 3 can be formed by first providing a P substrate 200, forming shallow trench isolation regions 220 in the substrate, and thereafter providing the N-well tub 210 by low-level implant followed by diffusion into the substrate.

Additional implants of N-type and P-type impurities may be utilized to define the doping concentration of channels 235/245. Following these implants, a gate oxide layer which will later be formed into gate oxide regions 262, 264 may be prepared by oxidating the surface of substrate 320. A polysilicon layer is deposited following formation of the oxide layer, and both layers are patterned and etched to form floating gate $FG_1$ and oxides 262/264. Subsequently, impurity implants and masking steps can be utilized to provide a self-aligned N+ region 230 and P+ regions 240 and 250.

It should be further well understood by reference to the above-mentioned patent applications, herein incorporated by reference, that the array control gate (ACG) may be formed by utilizing any number of techniques to provide the control gate in either a polysilicon layer (which is the same as that forming the common floating gate 260, or a second polysilicon layer), or may be formed in a separate region of the substrate 230 isolated from the N-well 210. Again, standard masking and implantation techniques may be utilized to form this region.

The EEPROM cell of the present invention has been described in connection with the embodiments disclosed herein. Although an embodiment of the present invention has been shown and described in detail, along with variances thereof, many other varied embodiments that incorporate the teachings of the invention may be easily constructed by those skilled in the art that may fall within the scope of the present invention as claimed below.

What is claimed is:

1. A nonvolatile memory cell at least partially formed in a semiconductor substrate, comprising:
   a first avalanche injection element having a first active region of a first conductivity type and a second active region of a second conductivity type, separated by a channel region of said second conductivity type, said first avalanche injection element being provided in a well of said first conductivity type;
   a second avalanche injection element having a third active region of said second conductivity type and sharing said second active region with said first avalanche injection element, the second avalanche injection element having a channel region of said first conductivity type, said second avalanche injection element also being provided in said well of said first conductivity type; and
   a common floating gate at least partially overlying said first and second avalanche injection elements.

2. The nonvolatile memory cell of claim 1 wherein said first active region comprises highly doped N-type impurity regions, and said second active region comprises a highly doped P-type impurity region.

3. The nonvolatile memory cell of claim 1 wherein said third active region comprises a P-type impurity regions.

4. The nonvolatile memory cell of claim 3 wherein said first active region has a doping concentration of approximately $10^{17}$–$10^{20}$ cm$^{-3}$ of boron and said channel regions of said second conductivity type have a doping concentration of $10^{15}$–$10^{17}$ of phosphorous.

5. The nonvolatile memory cell of claim 4 wherein said third active region has a doping concentration of $10^{18}$–$10^{20}$ cm$^{-3}$ of boron and said channel region of said first conductivity type has a doping concentration of $10^{15}$–$10^{17}$ of phosphorous.

6. The nonvolatile memory cell of claim 1 wherein said first avalanche element is used to program the cell and the second avalanche element is used to erase the cell.

7. The nonvolatile memory cell of claim 1 wherein said common floating gate is coupled to a control gate voltage.

8. The nonvolatile memory cell of claim 1 wherein said first avalanche injection element and said second avalanche element are provided in an N-well and a P-substrate.

9. A nonvolatile memory cell in an N-well of a P-substrate, comprising:
   a first avalanche injection element having an N+/P junction, the first avalanche injection element having an N-type first active region and a P-type second active region, separated by a P-type channel region, the first avalanche injection element being provided in an N-well;
   a second avalanche injection element having a P+/N junction, the second avalanche injection element having a P-type third active region and sharing the P-type second active region with the first avalanche injection element, the second avalanche injection element having an N-type channel region, the second avalanche injection element also being provided in the N-well; and
   a floating gate capacitively coupled to the first and second avalanche injection elements.

10. The memory cell of claim 9 wherein said first avalanche element comprises an erase element and said second avalanche element comprises a program element.

11. The memory cell of claim 9 wherein said first avalanche element includes a first active region having an N+ impurity type at a doping concentration of approximately $5 \times 10^{17}$–$10^{20}$ cm$^{-3}$ and a P-type impurity channel region having a doping concentration of approximately $10^{15}$–$10^{17}$ cm$^{-3}$ provided adjacent to a second active region having a P concentration of approximately $10^{18}$–$10^{20}$ cm$^{-3}$.

12. The memory cell of claim 9 wherein said second avalanche element includes a third active region of a P-type impurity having a doping concentration of approximately $10^{18}$–$10^{20}$ cm$^{-3}$ adjacent to an N-type impurity region having a doping concentration of approximately $10^{15}$–$10^{17}$ cm$^{-3}$ and said second active region.

13. The memory cell of claim 9 wherein said first avalanche element and second avalanche element are provided in an N-well.

14. An array of non-volatile memory cells, each cell comprising:
   a first avalanche injection element having a first active region of a first conductivity type and a second active region of a second conductivity type, separated by a channel region of said second conductivity type;
   a second avalanche injection element having a third active region of said second conductivity type and sharing said second active region with said first avalanche injection element, the second avalanche injection element having la channel region of said first conductivity type;
   a well region of a first conductivity type containing said first avalanche injection element and said second avalanche injection element; and
   a floating gate overlying at least a portion of said first and second avalanche injection elements.

* * * * *